(12) United States Patent
Cok (10) Patent No.: US 8,803,857 B2
(45) Date of Patent: Aug. 12, 2014

(54) CHIPLET DISPLAY DEVICE WITH SERIAL CONTROL

(76) Inventor: Ronald S. Cok, Rochester, NY (US)

( * ) Notice: Subject to any disclaimer, the term of this patent is extended or adjusted under 35 U.S.C. 154(b) by 704 days.

(21) Appl. No.: 13/024,771

(22) Filed: Feb. 10, 2011

(65) Prior Publication Data

US 2012/0206499 A1 Aug. 16, 2012

(51) Int. Cl.
*G06F 3/038* (2013.01)

(52) U.S. Cl.
USPC .......................................................... 345/204

(58) Field of Classification Search
USPC .................................................. 345/690, 204
See application file for complete search history.

(56) References Cited

U.S. PATENT DOCUMENTS

| | | | | |
|---|---|---|---|---|
| 4,769,292 | A * | 9/1988 | Tang et al. | 428/690 |
| 5,061,569 | A * | 10/1991 | VanSlyke et al. | 428/457 |
| 5,109,348 | A * | 4/1992 | Pfeiffer et al. | 345/505 |
| 5,430,464 | A * | 7/1995 | Lumelsky | 345/555 |
| 6,232,946 | B1 * | 5/2001 | Brownlow et al. | 345/98 |
| 6,384,529 | B2 * | 5/2002 | Tang et al. | 313/506 |
| 6,582,980 | B2 * | 6/2003 | Feldman et al. | 438/28 |
| 6,879,098 | B2 * | 4/2005 | Buchwalter et al. | 313/500 |
| 6,888,523 | B2 * | 5/2005 | Yamaguchi | 345/87 |
| 7,078,670 | B2 * | 7/2006 | Atlas et al. | 250/208.1 |
| 7,259,740 | B2 * | 8/2007 | Haga et al. | 345/98 |
| 7,298,368 | B2 | 11/2007 | Anderson | |
| 7,557,367 | B2 * | 7/2009 | Rogers et al. | 257/9 |
| 7,622,367 | B1 * | 11/2009 | Nuzzo et al. | 438/472 |
| 7,782,311 | B2 * | 8/2010 | Higashi | 345/204 |
| 8,497,821 | B2 * | 7/2013 | Cok | 345/76 |
| 2002/0078559 | A1 * | 6/2002 | Buchwalter et al. | 29/832 |
| 2002/0093290 | A1 * | 7/2002 | Yamazaki | 315/169.3 |
| 2002/0142504 | A1 * | 10/2002 | Feldman et al. | 438/30 |
| 2003/0067434 | A1 * | 4/2003 | Haga et al. | 345/98 |
| 2006/0055864 | A1 * | 3/2006 | Matsumura et al. | 349/187 |
| 2007/0032089 | A1 * | 2/2007 | Nuzzo et al. | 438/725 |

(Continued)

FOREIGN PATENT DOCUMENTS

| | | |
|---|---|---|
| EP | 1437703 A1 | 7/2004 |
| WO | WO 2010/046638 | 4/2010 |

OTHER PUBLICATIONS

Harada, "Distinguished Paper: A Novel Low-Power-Consumption All-Digital System-On-Glass Display with Serial Interface . . . ", SID 09 Digest, 28.1, pp. 383-386, 2009.

*Primary Examiner* — Amare Mengistu
*Assistant Examiner* — Sarvesh J Nadkarni
(74) *Attorney, Agent, or Firm* — Global OLED Technology LLC (57) ABSTRACT

A digital display apparatus includes an array of light-emitting pixels, each with a first and second electrode, formed on a display substrate. A plurality of chiplets is located on the display substrate, each chiplet including an electrode connection pad, a signal connection pad, and a pixel circuit. The electrode connection pad is connected to one of the first or second electrodes. Each chiplet includes one or more pixel circuits formed in the chiplet and electrically connected to the corresponding electrode and signal connection pads. A digital image signal is provided to the signal connection pad(s) of at least one of the chiplets. Each pixel circuit converts at least one digital image signal value to a continuously valued analog pixel-driving signal that controls the luminance of a pixel. The display provides higher-performance pixel circuits with digital control resulting in improved image quality.

10 Claims, 3 Drawing Sheets

(56) References Cited

U.S. PATENT DOCUMENTS

| | | | |
|---|---|---|---|
| 2007/0057263 A1* | 3/2007 | Kahen | 257/79 |
| 2007/0252855 A1* | 11/2007 | Hudson | 345/691 |
| 2009/0040198 A1* | 2/2009 | Lu et al. | 345/204 |
| 2009/0199960 A1* | 8/2009 | Nuzzo et al. | 156/230 |
| 2010/0123268 A1* | 5/2010 | Menard | 264/293 |
| 2010/0156766 A1* | 6/2010 | Levey et al. | 345/78 |
| 2010/0207848 A1* | 8/2010 | Cok | 345/76 |
| 2011/0043541 A1* | 2/2011 | Cok | 345/690 |

* cited by examiner

CHIPLET DISPLAY DEVICE WITH SERIAL CONTROL

CROSS REFERENCE TO RELATED APPLICATIONS

Reference is made to commonly-assigned, co-pending U.S. patent application Ser. No. 12/371,666, filed Feb. 16, 2009, entitled "CHIPLET DISPLAY DEVICE WITH SERIAL CONTROL" by R. Cok, to commonly-assigned, co-pending U.S. patent application Ser. No. 12/372,906, filed Feb. 18, 2009, entitled "DISPLAY DEVICE WITH CHIPLET DRIVERS" by R. Cok et al. and to commonly-assigned, co-pending U.S. patent application Ser. No. 12/492,678, filed Jun. 26, 2009, entitled "PASSIVE-MATRIX CHIPLET DRIVERS FOR DISPLAYS" by R. Cok and commonly-assigned, co-filed U.S. patent application Ser. No. 13/024,799, entitled "DIGITAL DISPLAY WITH INTEGRATED COMPUTING CIRCUIT" by R. Cok et al., the disclosures of which are incorporated by reference herein.

FIELD OF THE INVENTION

The present invention relates to digital display apparatus having a substrate with distributed, independent chiplets for controlling pixels in the display.

BACKGROUND OF THE INVENTION

Flat-panel display devices are widely used in conjunction with computing devices, in portable electronic devices, and for entertainment devices such as televisions. Such displays typically employ a plurality of pixels distributed over a substrate in a display area to display images. Each pixel incorporates several, differently colored light-emitting elements commonly referred to as sub-pixels, typically emitting red, green, and blue light, to represent each image element. As used herein, pixels and sub-pixels are not distinguished and refer to a single light-emitting element. A variety of flat-panel display technologies are known, for example plasma displays, liquid crystal displays, and light-emitting diode (LED) displays including organic light-emitting diode (OLED) displays.

Light emitting diodes (LEDs) incorporating thin films of light-emitting materials forming light-emitting elements have many advantages in a flat-panel display device and are useful in optical systems. Color displays that include an array of organic LED light-emitting elements have been demonstrated. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can include a patterned light-emissive layer wherein different materials are employed in the pattern to emit different colors of light when current passes through the materials. Alternatively, one can employ a single emissive layer, for example, a white-light emitter, together with color filters for forming a full-color display. It is also known to employ a white sub-pixel that does not include a color filter. One design described in the prior art includes an unpatterned white emitter together with a four-color pixel including red, green, and blue color filters and sub-pixels and an unfiltered white sub-pixel to improve the efficiency of the device.

Two different methods for controlling the pixels in a flat-panel display device are generally known: active-matrix control and passive-matrix control. In a passive-matrix device, the substrate does not include any active electronic elements (e.g. transistors). An array of row electrodes and an orthogonal array of column electrodes in a separate layer are formed over the substrate; the intersections between the row and column electrodes defining the electrodes of a light-emitting diode. Passive-matrix devices are controlled by the sequential activation of, for example, row electrodes while electrodes connected to each column of pixels in an array are provided with respective analog data values. When the row electrode is activated, each column in the row of pixels is driven to a luminance corresponding to the data value on the associated column electrode. The process is sequentially repeated for each row in the pixel array.

External driver chips sequentially supply current to each row (or column) while the orthogonal column (or row) supplies a suitable voltage to illuminate each light-emitting diode in the row (or column). Therefore, a passive-matrix design employs 2n connections to produce $n^2$ separately controllable light-emitting elements. However, a passive-matrix drive device is limited in the number of rows (or columns) that can be included in the device since the sequential nature of the row (or column) driving creates flicker. If too many rows are included, the flicker can become perceptible. Typically, passive-matrix devices are limited to about 100 lines, far fewer than is found in contemporary large-panel displays, for example such as high-definition televisions that have over 1,000 lines and are therefore unsuitable for passive-matrix control. Moreover, the currents necessary to drive an entire row (or column) in a passive-matrix display can be problematic and limits the physical size of a passive-matrix display. Furthermore, the external row and column driver chips for both passive- and active-matrix displays are expensive.

In an active-matrix device, a data value is likewise applied to every column electrode in an array and a select signal associated with a row activated to deposit the data values in a storage element associated with each pixel in the array. Again, the process is sequentially repeated for each row. An important distinguishing characteristic of the active-matrix devices is that the data values are stored with each pixel, thereby enabling the pixel to emit light even when the select signal for that pixel is inactive. In both passive- and active-matrix cases, signal lines form a two-dimensional matrix of vertical and horizontal wires, each driven by external drivers (see, e.g. U.S. Pat. No. 6,232,946). Alternatively, the driving chips can be located on the substrate outside the image display area (see, e.g. U.S. Pat. No. 6,582,980). The wiring for the signals also takes up a considerable area on a substrate, thereby reducing the aperture ratio or increasing the number of metal layers on the substrate and the cost, and is limited in the frequency at which it can operate and the current that can be employed.

In an active-matrix device, active control elements are formed of thin films of semiconductor material, for example amorphous or poly-crystalline silicon, coated over a flat-panel display substrate. Typically, each pixel is controlled by one control element and each control element includes at least one transistor. For example, in a simple active-matrix organic light-emitting (OLED) display, each control element includes two transistors (a select transistor and a power transistor) and one capacitor for storing a charge specifying the luminance of the pixel. Each light-emitting element typically employs an independent control electrode and an electrode electrically connected in common Control of the light-emitting elements can be provided through an analog data signal line, a select signal line, a power connection and a ground connection. For an example of an active-matrix display having digital driving methods, see U.S. Pat. No. 7,782,311.

One common, prior-art method of forming active-matrix control elements typically deposits thin films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of displays employing such materials. In such active-matrix designs, each light-emitting element requires a separate connection to a driving circuit.

Both the active-matrix and the passive-matrix control schemes rely on matrix addressing; the use of two control lines for each pixel element to select one or more pixels. This technique is used because other schemes such as direct addressing (for example as used in memory devices) require the use of address decoding circuitry that is very difficult to form on a conventional thin-film active-matrix backplane and impossible to form on a passive-matrix backplane. Another data communication scheme, for example used in CCD image sensors as taught in U.S. Pat. No. 7,078,670, employs a parallel data shift from one row of sensors to another row, and eventually to a serial shift register that is used to output the data from each sensor element. This arrangement requires interconnections between every row of sensors and an additional, high-speed serial shift register. Moreover, the logic required to support such data shifting would require so much space in a conventional thin-film transistor active-matrix backplane that the resolution of the device would be severely limited and is impossible in a passive-matrix backplane.

Active-matrix elements are not necessarily limited to displays and can be distributed over a substrate and employed in other applications requiring spatially distributed control. The same number of external control lines (except for power and ground) can be employed in an active-matrix device as in a passive-matrix device. However, in an active-matrix device, each light-emitting element has a separate driving connection from a control circuit and is active even when not selected for data deposition so that flicker is eliminated.

Employing an alternative control technique, Matsumura et al., in U.S. Patent Application Publication No. 2006/0055864, describe crystalline silicon substrates used for driving LCD displays. The application describes a method for selectively transferring and affixing pixel-control devices made from first semiconductor substrates onto a second planar display substrate. Wiring interconnections within the pixel-control device and connections from busses and control electrodes to the pixel-control device are shown. A matrix-addressing pixel control technique is taught and therefore suffers from the same limitations as noted above.

WO2010046638 describes active matrix devices with chiplets connected in a logical chain.

The signals that actually control the pixel elements in a display area on a flat-panel display substrate are analog, that is the amount of light emitted or controlled by the pixel element is continuously responsive to a continuous signal, for example a voltage or current signal. Image data, for example the originally-broadcast television image signals, can be likewise analog. However, image data is often stored and transmitted in a digital format. In order to display an image, therefore, the digital image data is converted to an analog form and then transmitted to the display, for example as disclosed in U.S. Pat. No. 6,888,523. U.S. Pat. No. 7,259,740 discloses locating a digital-to-analog converter in data-line driver chips that are affixed to the display substrate external to the display area. Unfortunately, the analog data signals are subject to degradation in both transmission and storage, particularly for large displays and for passive-matrix displays. Large transmission line effects in data and control lines on a large display can reduce frame frequency and thereby induce flicker or increase the current and voltage signal line drive requirements beyond what is feasible.

One mechanism for employing digital signals to drive display pixels is to employ time-domain pulse-width modulation, for example as disclosed in U.S. Patent Application No. 2007/0252855. In this technique, each image frame is temporally subdivided into shorter sub-frames that are too short to be distinguishable to a viewer so that flicker is not induced. Pixels are then turned fully on or fully off during the sub-frame times. The proportion of time that a pixel is turned on corresponds to the relative gray level of the pixel. For example, a pixel at maximum brightness is turned on 100% of the time; a pixel at 50% brightness is turned on 50% of the time, and so on. This method, however, requires very high-frequency control signals to provide an adequate gray scale resolution; such high-frequency signals can be difficult to maintain in a flat-panel display, especially a large display having lengthy signal lines. Another method employing digital signals is described in commonly assigned US 2010/0156766.

A related method described in "A Novel Low-Power-Consumption All-Digital System-on-Glass Display with Serial Interface" in the Society for Information Display Digest 2009, 28.1, subdivides a pixel into separate, digitally controlled pixel portions that are each activated to emit an amount of light corresponding to the area of the pixel portion, for example by supplying a common current density to all of the pixel portions, regardless of area. The pixel portions can have different areas, for example varying in area by powers of two. By controlling a desired combination of pixel portions, a gray scale is provided. However, such a method requires separate construction and control of the portions, decreasing the aperture ratio and increasing circuit size.

There is a need, therefore, for an improved control method for display devices that overcomes the control and wiring problems noted above.

SUMMARY OF THE INVENTION

In accordance with the present invention, there is provided a digital display apparatus, comprising:

(a) a display substrate having a display area on a process side of the display substrate;

(b) an array of pixels formed on the display substrate process side in the display area, each pixel including a first electrode, one or more layers of light-emitting material located over the first electrode, and a second electrode located over the one or more layers of light-emitting material, wherein the pixels emit light in response to a current provided through the first and second electrodes;

(c) a plurality of chiplets located on the display substrate process side in the display area, each chiplet including a chiplet substrate separate and distinct from the display substrate, an electrode connection pad, and a signal connection pad formed over the chiplet substrate, the electrode connection pad connected to one of the first or second electrodes and wherein each chiplet includes one or more pixel circuits formed in the chiplet and electrically connected to the corresponding electrode connection pad and the corresponding signal connection pad;

(d) means for providing a digital image signal including one or more digital luminance values to the signal connection pad(s) of at least one of the chiplets; and (e) wherein each pixel circuit includes a digital luminance value converter circuit for converting at least one digital luminance value to a continuously valued analog pixel-driving signal that controls the luminance of the pixel connected to the at least one electrode connector.

The present invention has the advantage of providing a display with higher-performance pixel circuits, image quality, and digital control.

Because the various layers and elements in the drawings have greatly different sizes, the drawings are not to scale.

DETAILED DESCRIPTION OF THE INVENTION

Figure 1:
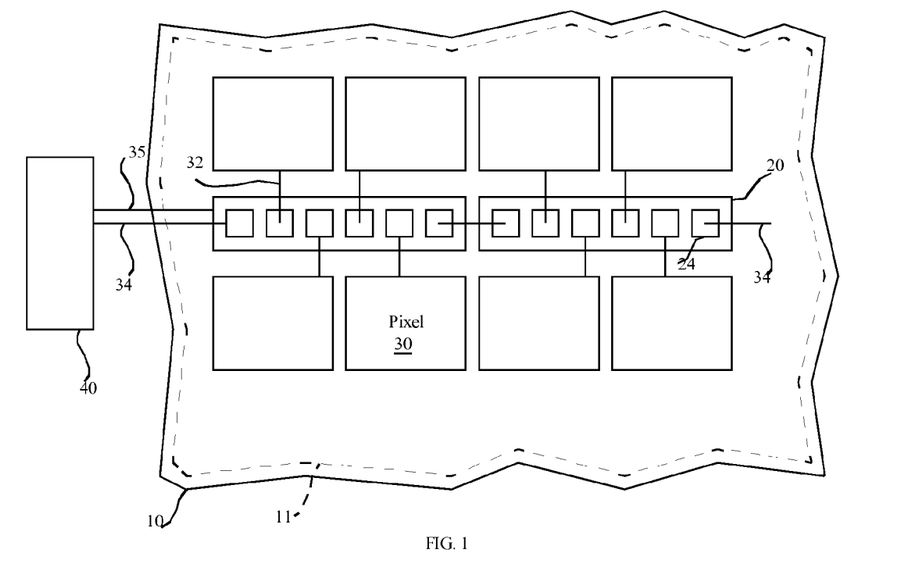
FIG. 1 is a schematic illustrating an embodiment of the present invention.
Figure 2:
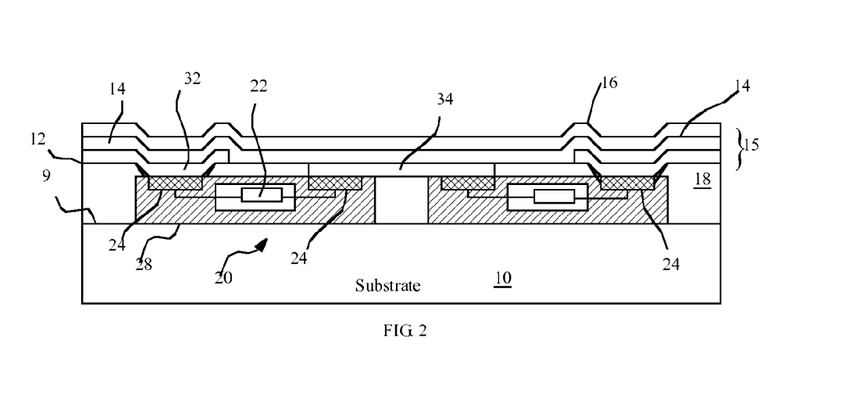
FIG. 2 is a cross section of a chiplet and pixel according to an embodiment of the present invention.

Referring to FIGS. 1 and 2, in one embodiment of the present invention, a digital display device and system includes a display substrate 10 having a display area 11 on a process side 9 of the display substrate 10. An array of pixels 30 is formed on the display substrate 10 process side 9 in the display area 11, each pixel 30 including a first electrode 12, one or more layers 14 of light-emitting material located over the first electrode 12, and a second electrode 16 located over the one or more layers 14 of light-emitting material, wherein the pixels 30 emit light in response to a current provided by the first and second electrodes 12, 16 through the one or more layers of light-emitting material 14. The layers 12, 14 and 16 define a pixel 30, for example an organic light-emitting diode 15, in the areas where all three layers 12, 14, 16 overlap and current can flow through the one or more layers 14 of light-emitting material from the electrodes 12, 16.

Figure 3:
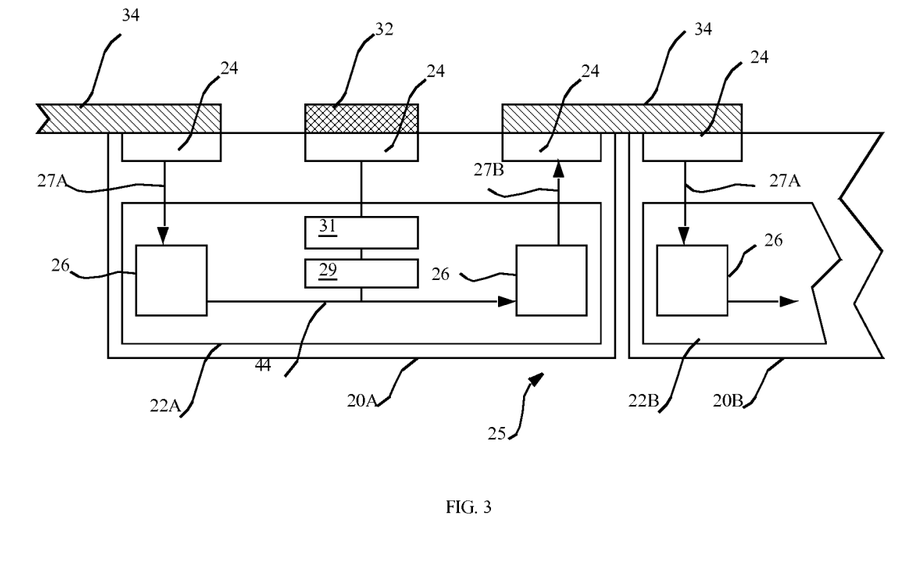
FIG. 3 is a cross section of a chiplet and circuitry according to an embodiment of the present invention.

A plurality of chiplets 20 is located on the display substrate 10 process side 9 in the display area 11, each chiplet 20 including a chiplet substrate 28 separate and distinct from the display substrate 10. One or more electrode and signal connection pads 24 are formed over the chiplet substrate 28. As shown in FIG. 3, each chiplet 20 includes one or more pixel circuits 22 formed in the chiplet 20 and electrically connected through the electrode connection pads 24 to at least one electrode connector 32 and electrically connected through the signal connection pads 24 for receiving one or more digital luminance values in a digital image signal provided by a controller 40 external to the display area 11. Each pixel circuit 22 includes a digital luminance value convertor circuit 29 (see FIG. 3) for converting at least one digital luminance value to a pixel driving signal that controls the luminance of the pixel 30 connected to the at least one electrode connector 32. As shown in FIG. 2, a plurality of electrode connectors 32 can be formed on the display substrate 10 on process side 9 in the display area 11 to electrically connect the first or second electrodes 12, 16 to electrode connection pads 24. FIG. 1 shows that a plurality of signal connectors 34 can transmit digital image signals from the controller 40 to a signal connection pad 24 on a chiplet 20 or from a signal connection pad 24 one chiplet 20 to a signal connection pad 24 on another chiplet 20. At least one signal connector 34 is externally accessible from the digital display device for receiving the digital image signal.

As shown in FIGS. 2 and 3, each chiplet 20 has a chiplet substrate 28 that is independent and separate from the display device substrate 10 and is located on process side 9. As used herein, distributed over the substrate 10 means that the chiplets 20 are not located solely around the periphery of the pixel array but are located within the array of pixels, that is, beneath (that is, the chiplet 20 is located between the pixel 30 and the substrate 10), above (that is, the chiplet 20 is located on the opposite side of the pixel 30 from the substrate 10), or between pixels 30 in the display area 11. Each chiplet 20 includes pixel circuits 22, for example including a store-and-forward circuit 26 and a pixel driver circuit 31. Connection pads 24 can be formed on the surface of the chiplets 20 to connect the chiplets to the pixels 30 through electrode connectors 32. Planarization layers 18 can be employed to assist in photolithographically forming electrical connections e.g. electrode and signal connectors 32, 34, with the connection pads 24. Preferably, chiplet interconnection busses are formed in a single wiring layer at least partially above the chiplets 20.

Referring to FIG. 3, in one embodiment of the present invention, the digital image signal is a serial signal transmitted on a serial signal connector (e.g. 34) and each pixel circuit 22A and 22B located respectively on chiplets 20A and 20B includes one or more store-and-forward circuits 26 having an input 27A and an output 27B. The store-and-forward circuit 26 can include, for example a D flip-flop controlled by a clock. In a further embodiment of the present invention, the input 27A of a store-and-forward circuit 26 in a pixel circuit 22B in a first chiplet 20B is connected to the output 27B of a pixel circuit 22A in a first chiplet 20A to form a serial shift register. The first pixel circuit 26 can be in the first chiplet 20A and the second pixel circuit 26 can be in the second chiplet 20B different from the first chiplet 20A. Multiple store-and-forward circuits 26 can form a serial shift register 25 that spans multiple chiplets 20.

Figure 4:
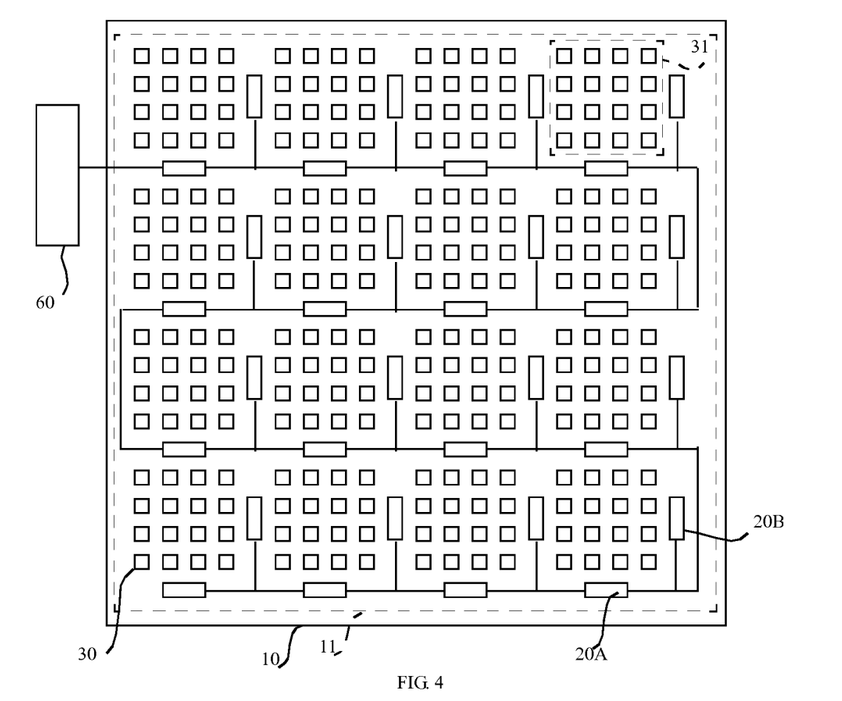
FIG. 4 is a schematic of an array of pixels in a display device with a serial connection for multiple rows according to an embodiment of the present invention.

The clock can be a common signal connected in series to two or more chiplets 20 or broadcast in parallel to all of the chiplets 20. The chiplets 20 can be connected in rows or columns. Each row (or column) of chiplets 20 can be connected to a different serial buss driven by the same, or different controllers 40. Alternatively, two or more different rows of chiplets 20 can be driven with the same serial buss by serially connecting separate rows together on the substrate 10. As shown in FIG. 4, alternating rows can be driven in alternating directions. Alternatively, all of the rows can be driven in the same direction (not shown).

A serial buss is one in which data is re-transmitted from one circuit to the next on electrically separated electrical connections; a parallel buss is one in which data is simultaneously broadcast to all of the chiplets on an electrically common electrical connection. A plurality of serially-connected, store-and-forward circuits 26 can be included within a chiplet 20 and connected to the electrical connections of the serial bus to form an independent set of store-and-forward circuits 26 on a single serial bus. Moreover, a plurality of serial busses serially-connecting a plurality of chiplets 20 in a plurality of sets can be employed. It is also possible to connect multiple serial busses to a chiplet 20 and to include multiple, serially-connected sets of store-and-forward circuits 26 within one chiplet 20. As shown in FIGS. 1 and 4, chiplets 20 can be arranged in a plurality of rows or columns. A serial bus can serially connect the chiplets 20 in two or more rows. Alternatively, a serial bus can serially connect the chiplets in two or more columns.

In an embodiment of the present invention, a serial bus connects a driving device (e.g. a controller 40) to a first store-and-forward circuit 26 with an electrical conductor (e.g. 34, 35). Each store-and-forward circuit 26 on the serial bus connects to the next store-and-forward circuit 26 with an electrically independent electrical conductor, so that all of the electrical conductors can communicate different data from one store-and-forward circuit 26 to the next at the same time, for example in response to a clock signal. The controller 40 provides a first digital luminance value and a control signal (e.g. clock) to the first store-and-forward circuit 26 connected to the controller 40 that enables the store-and-forward circuit 26 to store the digital luminance value. Once the first store-and-forward circuit 26 has stored the first digital luminance value, a second digital luminance value can be provided to the first store-and-forward circuit 26 at the same time as the first store-and-forward circuit 26 provides the first digital luminance value to a second store-and-forward circuit 26 connected to the first store-and-forward circuit 26. The control signal (for example, a clock signal) can be provided to all of the store-and-forward circuits together or can be propagated from one store-and-forward circuit to the next, much as the digital luminance values are propagated. The first store-and-forward circuit 26 then stores the second digital luminance value while the second store-and-forward circuit 26 stores the first digital luminance value. The process is then repeated with a third digital luminance value and a third store-and-forward circuit 26, and so on, so that digital luminance values are sequentially shifted from one store-and-forward circuit 26 to the next. Each chiplet 20 includes one or more store-and-forward circuits 26 so that the digital luminance values are shifted from one chiplet 20 to the next. In contrast, a parallel bus, as used herein, provides the same signal to every circuit (or chiplet) at the same time.

The digital image signal can include control signals to aid in controlling the pixel circuits 22 and store-and-forward circuits 26. For example, reset and clock signals can be useful. It can also be useful to transmit control signals on signal connectors, for example signal connectors 35 (FIG. 1), that are separate from signal connectors on which digital luminance values are transmitted.

The signal connectors 34, 35 can be connected to connection pads 24 on the chiplets 20. Internal chiplet connections 44 can be employed to connect each store-and forward circuit 26 to the next in a serial fashion. Other signals (e.g. a clock or reset signal) can pass through the chiplet 20 from one connection pad 24 to another connection pad 24 and thereby connect all of the chiplets in parallel, or serially, to a common signal.

According to an alternative embodiment of the present invention, two serial busses that are connected to a common chiplet are associated and are employed to form a differential signal pair. A differential signal is one in which the difference between the voltage on two separate wires forms the signal. For example, if both wires have the same voltage, a zero value is indicated. If the wires have a different voltage, a one value is indicated. Such differential signals are more robust in the presence of interference since both wires are likely to experience the same interference and react in the same way. If the voltage of both wires is modified similarly, the differential signal is not changed.

According to the present invention, the luminance values are transmitted as digital values. The control signals, however, can be analog. As noted above, the signal employed to drive the pixels 30 (for example on electrode connectors 32) is analog. Therefore, each digital luminance value convertor circuit 29 must convert a digital luminance value to an analog pixel driving signal that controls the luminance of the pixel 30 connected to the electrode connector 32, for example by using a digital-to-analog converter. The analog pixel driving signal can be a current signal or a voltage signal.

In one embodiment of the present invention, an individual digital luminance value convertor circuit 29 is provided in a chiplet 20 for each pixel 30. Alternatively, a single digital luminance value convertor circuit 29 can be provided in each chiplet 20 and used to convert the digital luminance signals to pixel driving signals for each pixel 30.

Each chiplet 20 can include pixel circuits 22 for controlling the pixels 30 to which the chiplet 20 is connected through connection pads 24. The circuitry 22 can include store-and-forward circuits 26 that store a digital luminance value representing a desired luminance for each pixel 30 to which the chiplet 20 is connected in a row or column, the chiplet 20 using such value to control either the first electrodes or second electrodes connected to the pixel 30 to activate the pixel 30 to emit light. The pixel circuits that generate the pixel driving signal can be active-matrix control circuits in various embodiments of the present invention. A wide variety of such circuits using an analog charge representing the luminance value are known in the art, that include both voltage control and current control of an electroluminescent pixel element.

Referring to FIG. 4, in an alternative embodiment of the present invention, the array of pixels 30 is divided into mutually exclusive pixel groups 31 arranged in rows and columns over the substrate 10 in the display area 11 and the pixel circuit is at least a portion of a passive-matrix control circuit that controls a pixel group and a separate digital luminance value convertor circuit drives the pixels in each column of a pixel group 31 to form a column-driver circuit. The pixel circuit, passive-matrix control circuit, or column driver-circuit can be formed in a chiplet 20A. The pixel circuit can also include a row-driver circuit in a separate chiplet 20B that is separate from the chiplet 20A. The row-driver circuit can be a common circuit electrically connected to a plurality of pixels formed in a common row or column of one of the pixel groups within a common chiplet. As is well-known in the art, rows and columns can be exchanged and the designation of row and column herein is arbitrary.

Figure 5:
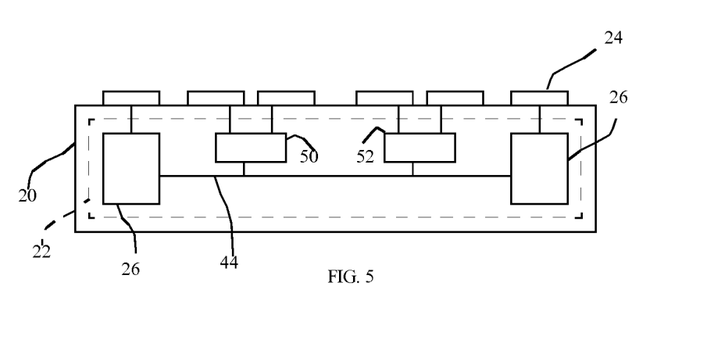
FIG. 5 is a cross section of a chiplet and circuitry according to an embodiment of the present invention.

Alternatively, as shown in FIG. 5, the column-driver circuit 50 can be located in the same chiplet 20 as the row-driver circuit 52. In this latter case, a single chiplet 20 is connected through connection pads 24 to both row and column electrodes of a pixel group. For example, if a row driver chiplet 20A (as in FIG. 3) is connected to 8 rows and a column driver chiplet is connected to 8 columns, eight storage circuits 26 can be employed to store luminance information for the 8 pixels connected to the row or column driver chiplet in one row or column. When a row or column is activated, luminance information can be supplied to the corresponding chiplet 20. In one embodiment of the present invention, two storage circuits 26 can be employed for each row or column connected to a chiplet, so that luminance information can be stored in one of the storage circuits 26 while the other storage circuit 26 is employed to display luminance information. In yet another embodiment of the present invention, one or two storage circuit 26 can be employed for each light-emitting element 30 to which the chiplet 20 is connected.

The digital image signal that includes the digital luminance values and optional control signals can be communicated to the digital luminance value converter circuits in various ways according to various embodiments of the present invention. In one embodiment of the present invention, the digital image signal is distributed in parallel to all of the chiplets, for example through signal connections 34 that directly connect each chiplet to a controller. Multiple controllers can be employed. Alternatively, the chiplets can be serially connected through signal connections 34 and the digital image signal is distributed serially from one chiplet to the next chiplet in the serial connection, as shown in FIGS. 1, 3, 4, and 5, by using store-and-forward circuits 26 that form a multi-chiplet serial shift register.

In operation, an external source of digital image signals, for example from a digital television source or computer, containing digital luminance values that describe the desired brightness of each of an array of multi-colored pixels, for example red, green, and blue or red, green, blue, and white, is communicated to a display controller. The display controller transmits the digital image signal with suitable control signals (such as a clock or reset signal) over signal connectors, e.g. a serial buss, to an array of chiplets located in a display area. The array of chiplets can include storage registers, for example serial shift registers, for storing digital luminance values. The stored digital luminance values can be converted to analog pixel driving signals with digital-to-analog convertors that are then transmitted to pixel electrodes controlling an array of pixels, for example organic light-emitting diodes, causing the pixels to emit light corresponding to the digital luminance values. Successive digital images can be displayed by the pixels sequentially using the same process. The analog pixel driving signals can form an active-matrix control circuit. Alternatively, an array of pixel groups can be defined. Each pixel group can be operated as an individual passive-matrix-controlled pixel array through local row and column electrodes controlled by one or more chiplets.

The present invention provides an advantage over the prior art in providing digital luminance values but with analog pixel driving. Prior-art methods, for example using thin-film transistors, cannot provide the digital signal propagation and conversion because the necessary logic is too large and has low performance. The present invention provides improved performance over techniques taught in the prior art. By employing a digital luminance signal, signal accuracy is maintained even when transmitting signals over large display areas, for example a meter on diagonal, or even more. Serial signal connections reduce the number of wires needed to interconnect the pixels in the display to a controller and chiplets formed in crystalline silicon provide high-speed, high-density circuits useful in receiving serial, digital luminance signals and controlling pixels. An array of chiplets enables relatively short, inter-chiplet connections, reducing signal propagation delays and increasing data transfer rates. Store-and-forward circuits can reconstruct serial digital signals, both data and control signals, as they are transmitted from one chiplet to another, further enabling high-speed communications. The high density of circuits within a chiplet enabled by crystalline silicon chiplet substrates enables complex drive circuitry for the pixels, for example including digital-to-analog converters, active-matrix circuits, and multiple passive-matrix circuit controllers to be formed within the chiplets. Feedback or detection circuits can also be formed within the chiplets to further improve the performance of the pixel driving circuits and the accuracy, stability, and uniformity of the pixel output. Such feedback signals can include measurements of pixel current or control voltage. Detection circuits can include light detection with photosensors.

In particular, OLED materials are known to age when used, increasing their drive current for a given light output. By employing sophisticated current-controlled pixel circuits within high-circuit-density chiplets, the light output can be consistently controlled over time.

The controller 40 can be implemented as a chiplet and affixed to the substrate 10. The controller 40 can be located on the periphery of the substrate 10, or can be external to the substrate 10 and include a conventional integrated circuit.

According to various embodiments of the present invention, the chiplets 20 can be constructed in a variety of ways, for example with one or two rows of connection pads 24 along a long dimension of a chiplet 20. The signal and electrode connectors can be formed from various materials and use various methods for deposition on the device substrate, for example a metal, either evaporated or sputtered, such as aluminum or aluminum alloys. Alternatively, the signal and electrode connectors can be made of cured conductive inks or metal oxides. In one cost-advantaged embodiment, the signal and electrode connectors are formed in a single layer.

The present invention is particularly useful for multi-pixel device embodiments employing a large device substrate, e.g. glass, plastic, or foil, with a plurality of chiplets 20 arranged in a regular arrangement over the device substrate 10. Each chiplet 20 can control a plurality of pixels 30 formed over the device substrate 10 according to the circuitry in the chiplet 20 and in response to control signal. Individual pixel groups or multiple pixel groups can be located on tiled elements, which can be assembled to form the entire display.

According to the present invention, chiplets 20 provide distributed pixel control elements over a substrate 10. A chiplet 20 is a relatively small integrated circuit compared to the device substrate 10 and includes one or more pixel circuits 22 including wires, connection pads, passive components such as resistors or capacitors, or active components such as transistors or diodes, formed on an independent substrate 28. Chiplets 20 are separately manufactured from the display substrate 10 and then applied to the display substrate 10. Details of these processes can be found, for example, in U.S. Pat. No. 6,879,098; U.S. Pat. No. 7,557,367; U.S. Pat. No. 7,622,367; US20070032089; US20090199960 and US20100123268.

The chiplets 20 are preferably manufactured using silicon or silicon on insulator (SOI) wafers using known processes for fabricating semiconductor devices. Each chiplet 20 is then separated prior to attachment to the device substrate 10. The crystalline base of each chiplet 20 can therefore be considered a substrate 28 separate from the device substrate 10 and over which the chiplet circuitry 22 is disposed. The plurality of chiplets 20 therefore has a corresponding plurality of substrates 28 separate from the device substrate 10 and each other. In particular, the independent substrates 28 are separate from the substrate 10 on which the pixels 30 are formed and the areas of the independent, chiplet substrates 28, taken together, are smaller than the device substrate 10. Chiplets 20 can have a crystalline substrate 28 to provide higher-performance active components than are found in, for example, thin-film amorphous or polycrystalline silicon devices. Chiplets 20 can have a thickness preferably of 100 um or less, and more preferably 20 um or less. This facilitates formation of the adhesive and planarization material 18 over the chiplet 20 that can then be applied using conventional spin-coating techniques. According to one embodiment of the present invention, chiplets 20 formed on crystalline silicon substrates are arranged in a geometric array and adhered to a device substrate (e.g. 10) with adhesion or planarization materials. Connection pads 24 on the surface of the chiplets 20 are employed to connect each chiplet 20 to signal wires, power busses and row or column electrodes (16, 12) to drive pixels 30. Chiplets 20 can control at least four pixels 30.

Since the chiplets 20 are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet 20, however, also requires connection pads 24 for making electrical connection to the wiring layer provided over the chiplets once assembled onto the display substrate 10. The connection pads 24 can be sized based on the feature size of the lithography tools used on the display substrate 10 (for example 5 um) and the alignment of the chiplets 20 to the wiring layer (for example +/−5 um). Therefore, the connection pads 24 can be, for example, 15 um wide with 5 um spaces between the pads. This means that the pads will generally be significantly larger than the transistor circuitry formed in the chiplet 20.

The pads can generally be formed in a metallization layer on the chiplet over the transistors. It is desirable to make the chiplet with as small a surface area as possible to enable a low manufacturing cost.

By employing chiplets with independent substrates (e.g. comprising crystalline silicon) having circuitry with higher performance than circuits formed directly on the substrate (e.g. amorphous or polycrystalline silicon), a device with higher performance is provided. Since crystalline silicon has not only higher performance but also much smaller active elements (e.g. transistors), the circuitry size is much reduced. A useful chiplet can also be formed using micro-electro-mechanical (MEMS) structures, for example as described in "A novel use of MEMS switches in driving AMOLED", by Yoon, Lee, Yang, and Jang, Digest of Technical Papers of the Society for Information Display, 2008, 3.4, p. 13.

The device substrate 10 can include glass and the wiring layers made of evaporated or sputtered metal or metal alloys, e.g. aluminum or silver, formed over a planarization layer (e.g. resin) patterned with photolithographic techniques known in the art. The chiplets 20 can be formed using conventional techniques well established in the integrated circuit industry.

In embodiments of the present invention using differential signal pairs, the substrate can preferably be foil or another solid, electrically-conductive material, and the two serial busses forming a differential signal pair can be laid out in a differential microstrip configuration referenced to the substrate, as known in the electronics art. In displays using non-conductive substrates, the differential signal pair can preferentially be referenced to the second electrode, and routed so that no portion of the first electrode of any pixel is located between the second electrode and either serial buss in the differential pair. LVDS (ETA-644), RS-485 or other differential signalling standards known in the electronics art can be employed on the differential signal pairs. A balanced DC encoding such as 4b5b can be employed to format data transferred across the differential signal pair, as known in the art.

The present invention can be employed in devices having a multi-pixel infrastructure. In particular, the present invention can be practiced with LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292 and U.S. Pat. No. 5,061,569. Inorganic devices, for example, employing quantum dots formed in a polycrystalline semiconductor matrix (for example, as taught in US App. No. 2007/0057263), and employing organic or inorganic charge-control layers, or hybrid organic/inorganic devices can be employed. Many combinations and variations of organic or inorganic light-emitting displays can be used to fabricate such a device, including active-matrix displays having either a top- or bottom-emitter architecture.

The invention has been described in detail with particular reference to certain preferred embodiments thereof, but it should be understood that variations and modifications can be effected within the spirit and scope of the invention.

PARTS LIST 9 display substrate process side
10 display substrate
11 display area
12 first electrode
14 layers of light-emitting material
15 light-emitting diode
16 second electrode
18 planarization layer
20, 20A, 20B chiplet
22, 22A, 22B pixel circuits
24 connection pad
25 serial shift register
26 store and forward circuit
27A input
27B output
28 chiplet substrate
29 digital luminance value convertor circuit
30 pixel
31 pixel driver circuit
32 electrode connectors
34 signal connector
35 signal connector
40 controller
44 internal chiplet connections
50 column-driver circuit
52 row-driver circuit

The invention claimed is:

1. A digital display apparatus, comprising:
   (a) a display substrate having a display area on a process side of the display substrate;
   (b) an array of pixels formed on the display substrate process side in the display area, each pixel including a first electrode, one or more layers of light-emitting material located over the first electrode, and a second electrode located over the one or more layers of light-emitting material, wherein the pixels emit light in response to a current provided through the first and second electrodes;
   (c) a plurality of chiplets located on the process side of the display substrate in the display area beneath the pixels, each chiplet including a chiplet substrate separate and distinct from the display substrate, an electrode connection pad, and a signal connection pad formed over the chiplet substrate, the electrode connection pad connected to one of the first or second electrodes and wherein each chiplet includes one or more pixel circuits formed in the chiplet and electrically connected to the corresponding electrode connection pad and the corresponding signal connection pad where each chiplet controls a plurality of pixels;
(d) means for providing a serial digital image signal including one or more digital luminance values to the signal connection pad(s) of the chiplets; and
(e) wherein each pixel circuit includes a digital luminance value converter circuit for converting at least one digital luminance value to a continuously valued analog pixel-driving signal that controls the luminance of the pixel which is directly connected to the at least one electrode connector and further includes one or more store-and-forward circuits having an input and an output.

2. The display device and system of claim 1, wherein the input of a store-and-forward circuit in a first pixel circuit is connected to the output of a second pixel circuit to form a serial shift register.

3. The display device and system of claim 2, wherein the first pixel circuit is in a first chiplet and the second pixel circuit is in a second chiplet different from the first chiplet.

4. The display device of claim 1, wherein the analog pixel driving signal is either a current or a voltage signal.

5. The display device of claim 1, wherein an individual digital luminance value converter circuit is provided for each pixel.

6. The display device of claim 1, wherein a digital luminance value converter circuit is provided in each chiplet.

7. The display device of claim 1, wherein the array of pixels is divided into mutually exclusive pixel groups arranged in rows and columns, wherein the pixel circuit includes a passive-matrix control circuit for controlling one or more of the pixel groups.

8. The display device of claim 7, wherein each passive-matrix control circuit includes a separate digital luminance value converter circuit for driving the pixels in each row or column of one or more of the corresponding pixel groups.

9. The display device of claim 7, further comprising a common circuit in a chiplet and connected to a plurality of pixels formed in a common row or column of one of the pixel groups.

10. The display device of claim 9, further including a plurality of common chiplets and wherein the common circuits are in common chiplets.

* * * * *